(12) United States Patent
Lai et al.

(10) Patent No.: US 10,910,301 B2
(45) Date of Patent: Feb. 2, 2021

(54) POST-GRIND DIE BACKSIDE POWER DELIVERY

(71) Applicant: Intel Corporation, Santa Clara, CA (US)

(72) Inventors: Min-Tih Ted Lai, Folsom, CA (US); Tyler Leuten, Orangevale, CA (US); Florence R. Pon, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/658,611

(22) Filed: Oct. 21, 2019

(65) Prior Publication Data

US 2020/0051903 A1 Feb. 13, 2020

Related U.S. Application Data

(63) Continuation of application No. 16/030,053, filed on Jul. 9, 2018, now Pat. No. 10,483,198, which is a (Continued)

(51) Int. Cl.
*H01L 23/498* (2006.01)
*H01L 25/065* (2006.01)
(Continued)

(52) U.S. Cl.
CPC .... *H01L 23/49838* (2013.01); *H01L 23/5223* (2013.01); *H01L 23/5383* (2013.01); *H01L 25/0657* (2013.01); *H01L 23/50* (2013.01); *H01L 23/5222* (2013.01); *H01L 23/5286* (2013.01); *H01L 2224/04042* (2013.01); *H01L 2224/16157* (2013.01); *H01L 2224/16227* (2013.01); *H01L 2224/16235* (2013.01); *H01L 2224/32145* (2013.01); *H01L 2224/32225* (2013.01); *H01L 2224/48091* (2013.01); *H01L 2224/48145* (2013.01);
(Continued)

(58) Field of Classification Search
CPC ............. H01L 21/486; H01L 23/49827; H01L 23/49838
See application file for complete search history.

(56) References Cited

U.S. PATENT DOCUMENTS 9,331,062 B1  5/2016  Lane et al.
10,032,707 B2  7/2018  Lai et al.
(Continued)

OTHER PUBLICATIONS

U.S. Appl. No. 15/391,587 U.S. Pat. No. 10,032,707, filed Dec. 27, 2016, Post-Grind Die Backside Power Delivery.
(Continued)

*Primary Examiner* — Daniel P Shook
(74) *Attorney, Agent, or Firm* — Schwegman Lundberg & Woessner, P.A.

(57) ABSTRACT

Disclosed is a die. The die may include a material layer, a plurality of vias, and a plurality of metal channels. The material layer may have a top side and a backside. The top side may include a plurality of pad connections. The plurality of vias may extend through the material layer from the top side to the backside. The plurality of metal channels may be in contact with the backside. Each of the plurality of metal channels may be in electrical communication with at least one of the plurality of pad connections and at least one of the plurality of vias.

25 Claims, 5 Drawing Sheets

Related U.S. Application Data continuation of application No. 15/391,587, filed on Dec. 27, 2016, now Pat. No. 10,032,707.

(51) Int. Cl.

| | | |
|---|---|---|
| *H01L 23/522* | (2006.01) | |
| *H01L 23/538* | (2006.01) | |
| *H01L 23/528* | (2006.01) | |
| *H01L 23/50* | (2006.01) | |

(52) U.S. Cl.
CPC ............ *H01L 2224/48227* (2013.01); *H01L 2224/73265* (2013.01); *H01L 2225/0651* (2013.01); *H01L 2225/06506* (2013.01); *H01L 2225/06562* (2013.01); *H01L 2924/10253* (2013.01); *H01L 2924/15192* (2013.01); *H01L 2924/3025* (2013.01)

(56) References Cited

U.S. PATENT DOCUMENTS

| | | | |
|---|---|---|---|
| 2003/0124767 | A1 | 7/2003 | Lee et al. |
| 2008/0315421 | A1 | 12/2008 | Periaman et al. |
| 2010/0013102 | A1 | 1/2010 | Tay et al. |
| 2012/0292777 | A1* | 11/2012 | Lotz .................. H01L 24/06 257/774 |
| 2018/0182699 | A1 | 6/2018 | Lai et al. |
| 2018/0315699 | A1 | 11/2018 | Lai et al. |

OTHER PUBLICATIONS

U.S. Appl. No. 16/030,053, filed Jul. 9, 2018, Post-Grind Die Backside Power Delivery.

"U.S. Appl. No. 15/391,587, Corrected Notice of Allowance dated Apr. 18, 2018", 2 pgs.

"U.S. Appl. No. 15/391,587, Examiner Interview Summary dated Feb. 16, 2018", 2 pgs.

"U.S. Appl. No. 15/391,587, Non Final Office Action dated Nov. 30, 2017", 9 pgs.

"U.S. Appl. No. 15/391,587, Notice of Allowance dated Mar. 28, 2018", 5 pgs.

"U.S. Appl. No. 15/391,587, Response filed Feb. 27, 2018 to Non Final Office Action dated Nov. 30, 2017", 12 pgs.

"U.S. Appl. No. 15/391,587, Response filed Nov. 8, 2017 to Restriction Requirement dated Oct. 6, 2017", 8 pgs.

"U.S. Appl. No. 15/391,587, Restriction Requirement dated Oct. 6, 2017", 7 pgs.

"U.S. Appl. No. 16/030,053, Non Final Office Action dated May 31, 2019", 7 pgs.

"U.S. Appl. No. 16/030,053, Notice of Allowance dated Jul. 10, 2019", 5 pgs.

"U.S. Appl. No. 16/030,053, Response to Non Final Office Aciton dated May 31, 2019", 4 pgs.

"International Application Serial No. PCT/US2017/063284, International Search Report dated Mar. 5, 2018", 3 pgs.

"International Application Serial No. PCT/US2017/063284, Written Opinion dated Mar. 5, 2018", 11 pgs.

\* cited by examiner

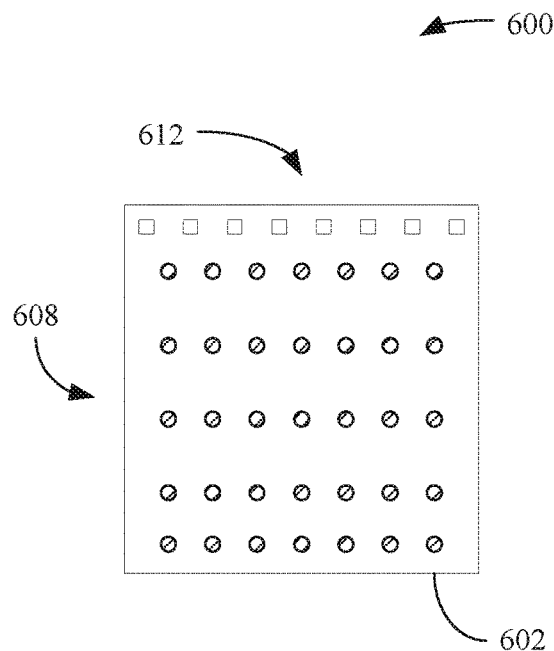
FIG. 6A
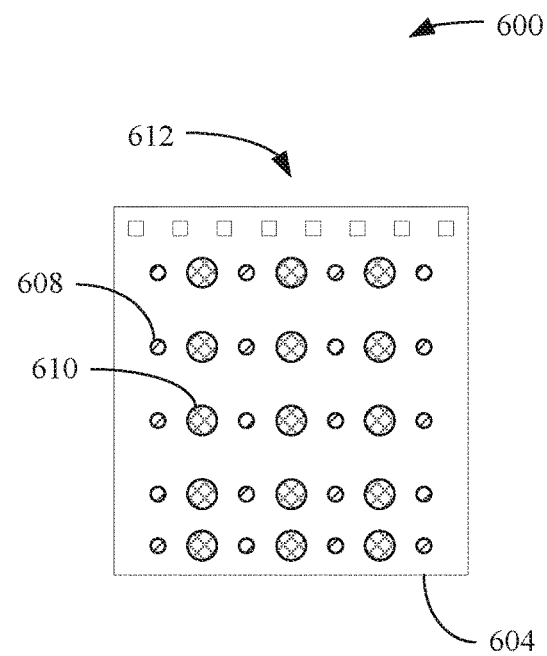
FIG. 6B
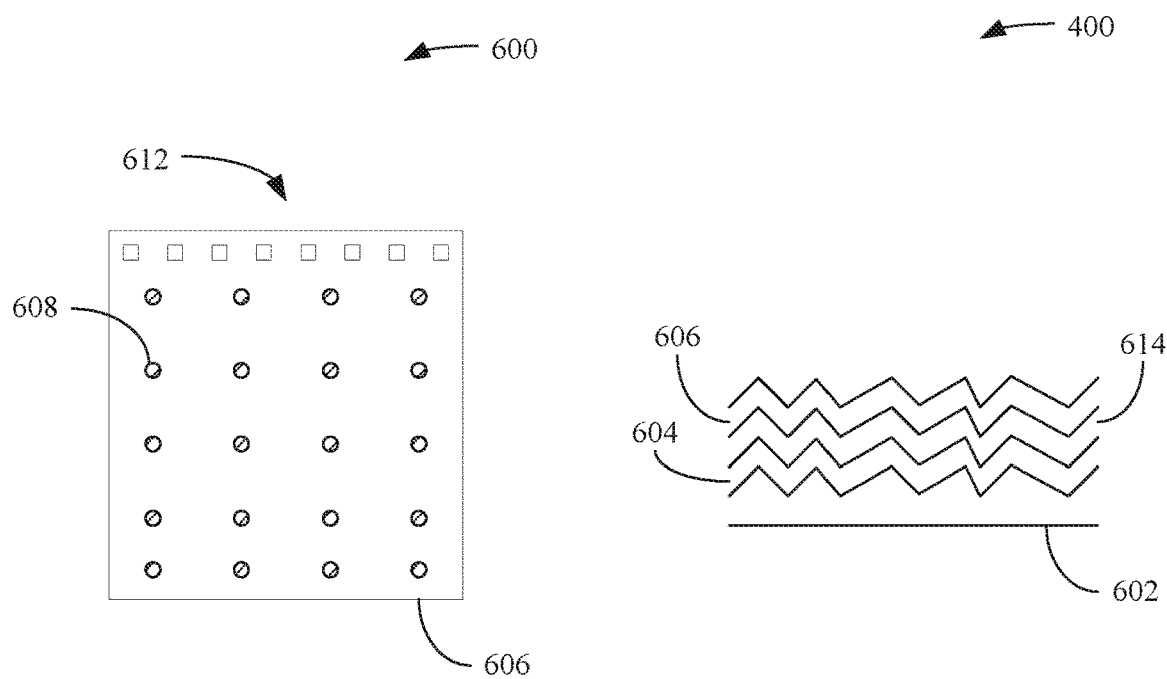
FIG. 6C
FIG. 6D

POST-GRIND DIE BACKSIDE POWER DELIVERY

CROSS-REFERENCE TO RELATED APPLICATION

This application is a continuation of U.S. patent application Serial No. is a continuation of U.S. patent application Ser. No. 16/030,053, filed Jul. 9, 2018, which is a continuation of U.S. patent application Ser. No. 15/391,587, filed Dec. 27, 2016, now issued as U.S. Pat. No. 10,032,707, each of which are incorporated by reference herein in their entirety.

TECHNICAL FIELD

Embodiments described generally herein relate to microelectronic packages. More particularly, embodiments described generally herein relate to power delivery features within microelectronic packages.

BACKGROUND

Microelectronics generally include a central processing unit (CPU). In order to enhance performance, CPU products are increasingly integrating multiple dies within the CPU package in a side-by-side or other multi-chip module (MCM) format.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 6A, 6B, 6C, and 6D illustrate a die in accordance with some embodiments disclosed herein.

DETAILED DESCRIPTION

Multichip modules may pack more than one integrated circuit (IC) into a package. Due to the ever advancing capabilities of the ICs, the tolerances for package limitations may be shrinking. One limitation may be the capability for wirebonds to delivery power to the IC with integrity to the desired voltage and against noise. Power delivery in the IC itself may be limited by the microscopic feature sizes of its production and through competition for space by functional gates.

As disclosed herein, power may be delivered within the IC through the addition of redistribution layer patterning in the post-grind step of the IC packaging. This redistribution layer may provide use to a surface on the backside of the IC to improve power delivery, integrity, and noise resistance. The redistribution layer may be a layer of material or may be series of strips or channels of material. For example, post-grind die backside features may be patterned on to the back of the die using simpler, less precise, and less risky patterning steps.

Figure 1:
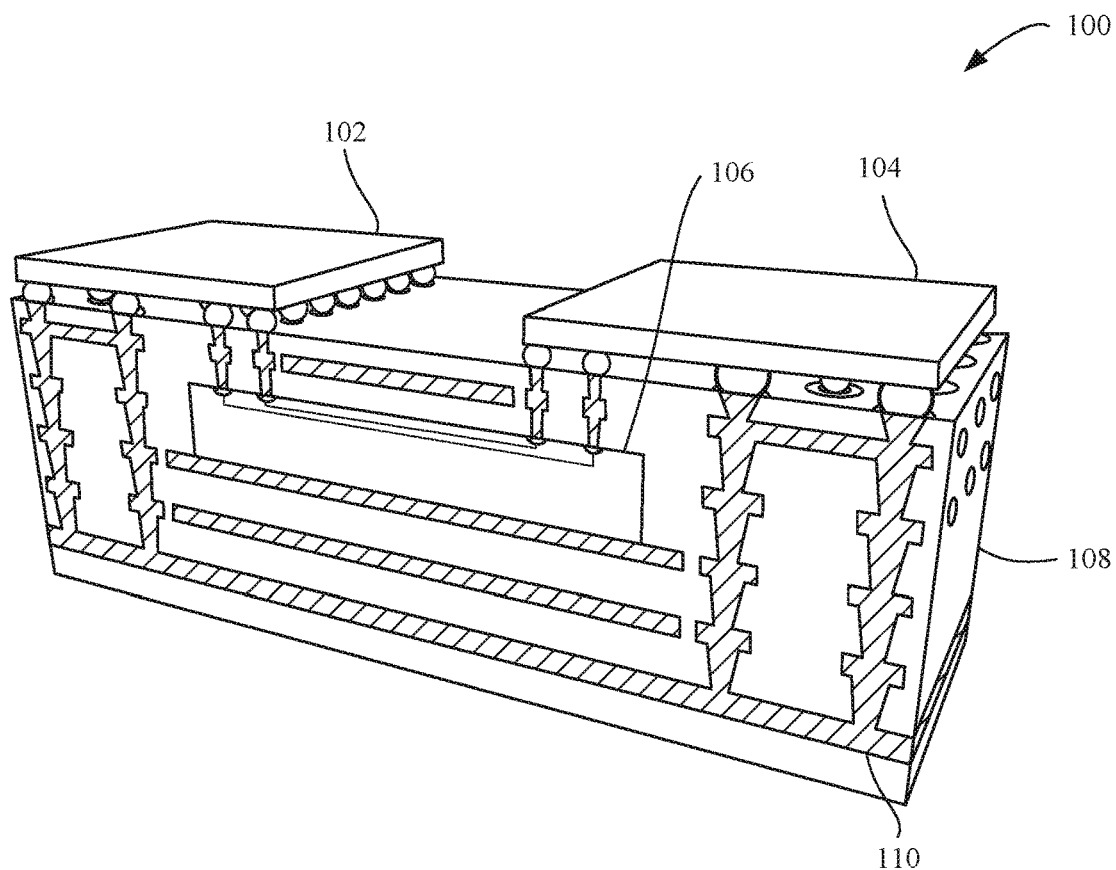
FIG. 1 illustrates a portion of a microelectronics package in accordance with some embodiments disclosed herein.

Turning now to the figures, FIG. 1 illustrates a microelectronic package 100. The microelectronic package 100 can include a first die 102, a second die 104, a package interconnect 106, and substrate 108. As shown in FIG. 1, the microelectronic package 100 can also include electrical connections 110 that can be used to power the first die 102 and the second die 104 and allow signals to pass between the first die 102 and the second die 104. The electrical connections 110 can also be used to provide ground references. The package interconnect 106 can be surrounded by, or embedded in, the substrate 108. In addition, the package interconnect 106 can include a silicon bridge, a silicon interposer, a fan-out wafer level package interconnect, a fan-out panel level package interconnect, and an organic dense multi chip package interconnect. While FIG. 1 illustrates an embedded multi-die interconnect bridge (EMIB), the various embodiments disclosed herein are not limited to EMIB technologies.

Figure 2:
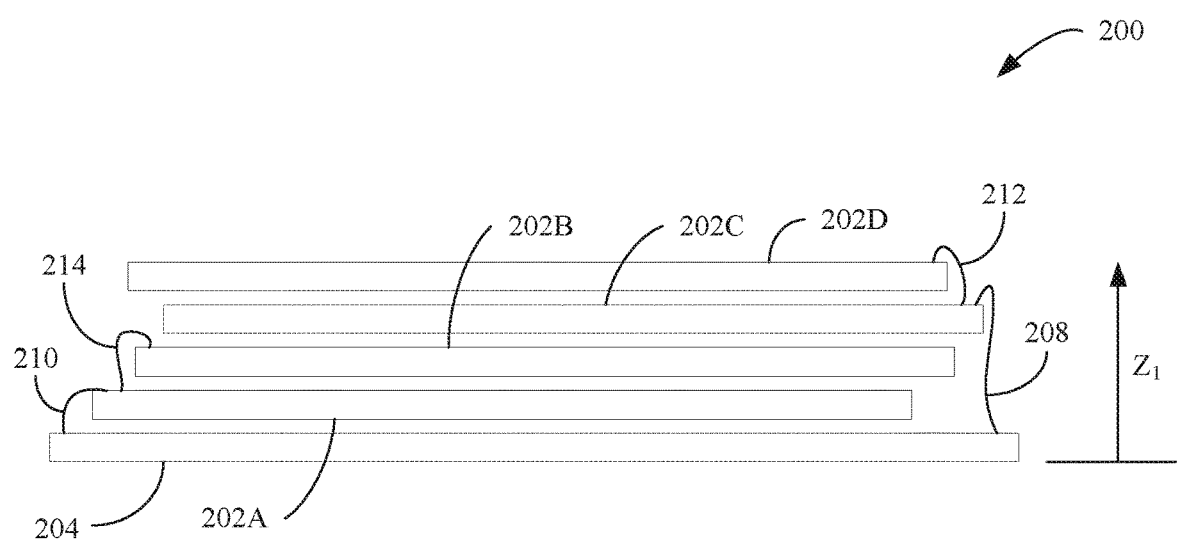
FIG. 2 illustrates a die stack in accordance with some embodiments disclosed herein.

FIG. 2 illustrates a die stack 200 using a zigzag wirebond, such as part of the microelectronics package 100. The die stack 200 may include a first material layer 202A, a second material layer 202B, a third material layer 202C, and a forth material layer 202D (collectively material layers 202). The material layers 202 may be located atop a substrate 204. The material layers 202 may be electrically connected to the substrate 204, directly or via another material layer. For example, the second material layer 202B and the fourth material layer 202D may be directly connected to the substrate 204 via wirebonds 208 and 210, respectively, as shown in FIG. 2. The first material layer 202A may be electrically connected to the second material layer 202B and the third material layer 202C may be electrically connected to the fourth material layer 202D via wirebonds 212 and 214, respectively.

The zigzag placement of the material layers 202 may result in a reduced Z-height, $Z_1$, of the die stack 200. In addition, a film over wire (FOW), not shown, may add additional height to the Z-height. The material layers 202 may be one or more dies that form the die stack 200.

Figure 3:
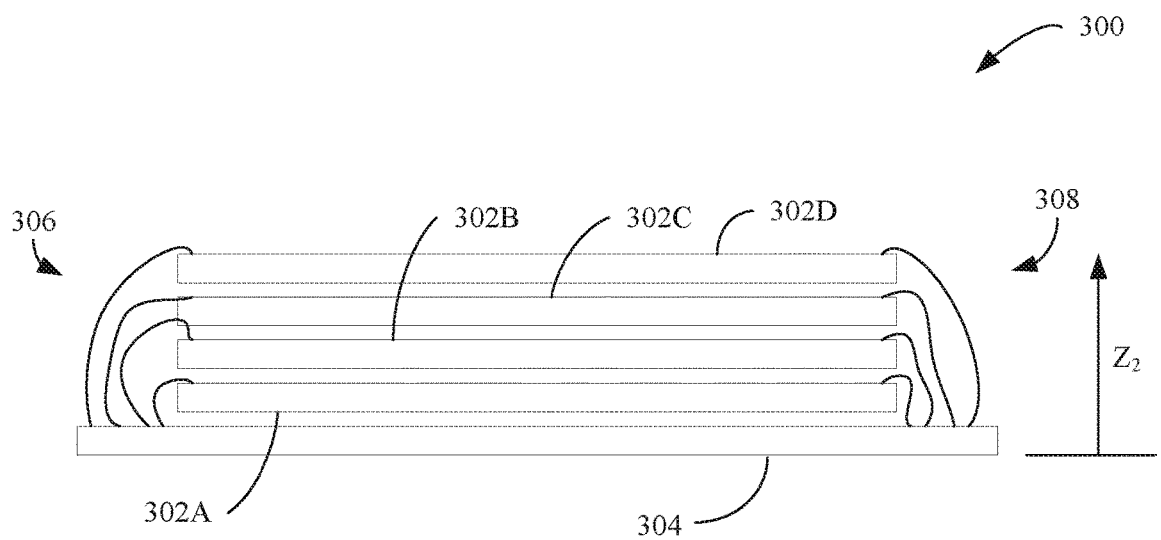
FIG. 3 illustrates a die stack in accordance with some embodiments disclosed herein.

FIG. 3 illustrates a die stack 300 using a stacked wirebond, such as part of the microelectronics package 100. The die stack 300 may include a first material layer 302A, a second material layer 302B, a third material layer 302C, and a fourth material layer 302D (collectively material layers 302). The material layers 302 may be located atop a substrate 304. The material layers 302 may be electrically connected to the substrate 304, directly or via another material layer. For example, the material layers 302 may be directly connected to the substrate 304 via wirebonds 306 and 308.

The placement of the material layers 302 may result in an increase in a Z-height, $Z_2$, of the die stack 300 due to space needed between the material layers 202 to accommodate the wirebonds 306 and 308. In addition, a film over wire, not shown, may add additional height to the Z-height. The material layers 302 may be one or more dies that form the die stack 300.

Figures 4A, 4B:
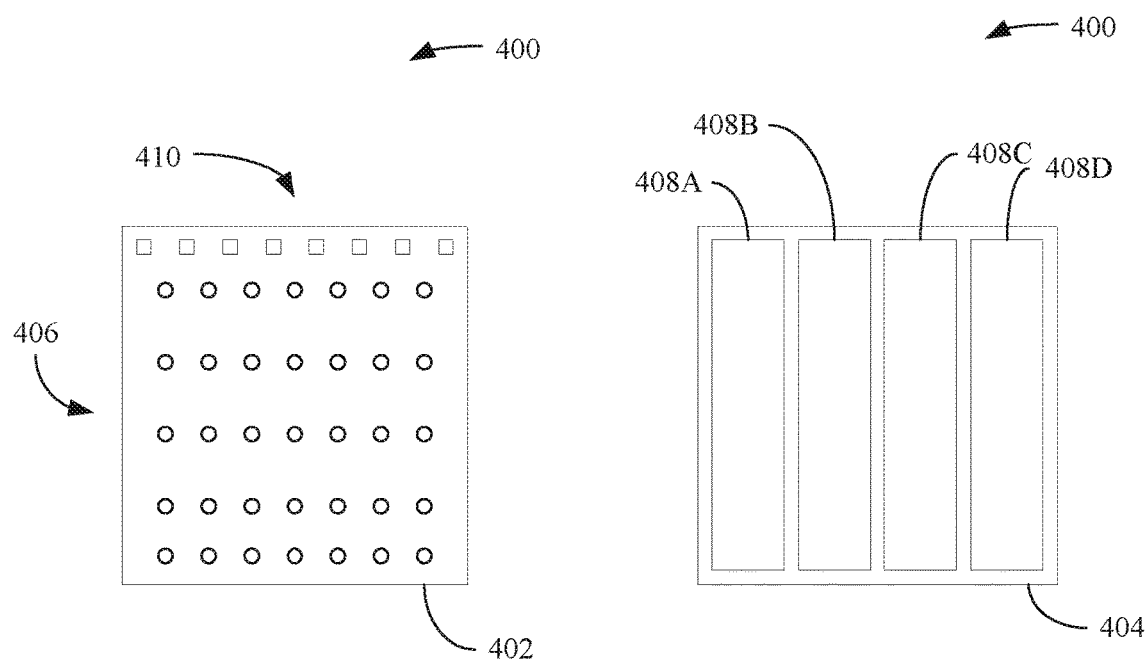
FIGS. 4A and 4B illustrate a die in accordance with some embodiments disclosed herein.

FIGS. 4A and 4B illustrate a top side 402 and a backside 404, respectively, of a die 400, such as part of the microelectronics package 100. The die 400 may be manufactured from a semiconductor material such as silicon. In addition, the die 400 may be one of a plurality of dies, that are part of a silicon wafer as described herein.

The die 400 may include a plurality of vias 406. The plurality of vias 406 may be through silicon vias (TSV). The plurality of vias 406 may pass partially or completely through the die 400. The plurality of vias 406 may receiving an electrically conductive material, such as copper or aluminum, to facilitate electrical connections as disclosed herein.

The backside 404 of the die 400 may include a first metal channel 408A, a second metal channel 408B, a third metal channel 408C, and a fourth metal channel 408D (collectively metal channels 408). The metal channels 408 may be formed of any electrically conductive material. In addition, the metal channels 408 may be formed via sputter coating or spin coating.

Each of the metal channels 408 may contact one or more of the plurality of vias 406. As a result, the metal channels 408 may allow for electrical connection of one or more subsections of the plurality of vias 408. In addition, the each of the plurality of metal channels 408 may have a width that is substantially wider than a width of a signal trace of the die 400. For example, each of the plurality of metal channels 408 may have a width that is one or two orders of magnitude larger than the width of the signal traces. By having a width that is larger than the signal traces, the metal channels 408 may help shield the signal traces form interference such as electromagnetic interference. In addition, the metal channels 408 may help to minimize cross talk between dies that are stacked or otherwise located adjacent to one another. The metal channels 408 may be made of copper, gold, platinum, aluminum, et.

In addition, the die 400 may include a plurality of pad connections 410. The plurality of pad connections 410 may allow power to flow from a substrate, such as substrate 204 or 304, to the vias 406. For example, the pad connections 410 may extend through the material layer and contact one or more of the metal channels 408.

While FIGS. 4A and 4B show a single die 400 having a material layer and vias 406, multiple dies may be stacked as disclosed herein. For example, a second material layer may be located on top of the die 400. The various material layers may be separated by an insulator or other material that may allow the various material layers to be electrically isolated from one another. The second, or subsequent, material layer may include a top side and a backside connected by a plurality of vias and pad connections just as die 400.

For example, a microelectronics package, such as microelectronics package 100, may include a substrate, a first die and a second die. The first die may be at least partially embedded within the substrate and may include a first material layer, a first plurality of vias, and a first plurality of metal channels. The first material layer may have a first top side and a first backside. The first top side may include a first plurality of pad connections. The first plurality of vias may extend through the first material layer from the first top side to the first backside. The first plurality of metal channels may be in contact with the first backside. Each of the first plurality of metal channels may be in electrical communication with at least one of the first plurality of pad connections and at least one of the first plurality of vias.

The second die may include a second material layer, a second plurality of vias, and a second plurality of metal channels. The second material layer may have a second top side and a second backside. The second top side may include a second plurality of pad connections in electrical communication with the first plurality of pad connections. The second plurality of vias may extend through the second material layer from the second top side to the second backside. The second plurality of metal channels may be in contact with the second backside. Each of the second plurality of metal channels may be in electrical communication with at least one of the second plurality of pad connections and at least one of the second plurality of vias.

Furthermore, a third die may be included in the microelectronics package. The third die may be connected to the first die or the second die via a bridge or other electrical connections. One or more of the metal channels may form a reference plane. In addition, the dies may include IC electrically coupled to the metal channels, vias, pad connections, etc.

Figures 5, 7:
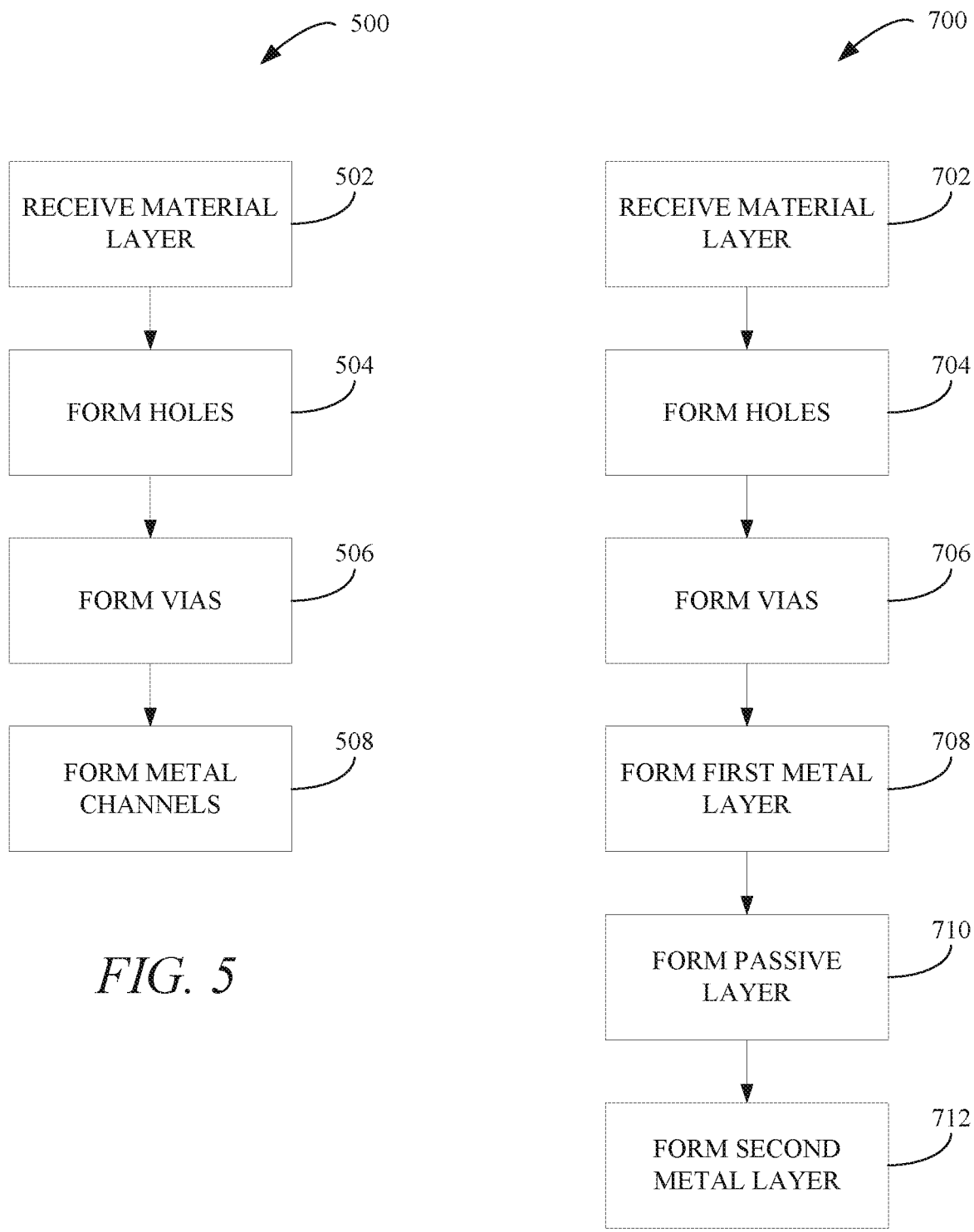
FIG. 5 illustrates a method in accordance with some embodiments disclosed herein.
FIG. 7 illustrates a method for manufacturing a die in accordance with some embodiments disclosed herein.

FIG. 5 illustrates a method 500 for manufacturing a die, such as die 400, in accordance with some embodiments disclosed herein. The method 500 may begin at stage 502 where a material layer may be received. The material layer, such as any one of material layers 202 or 204, may have a top side and a backside as disclosed herein. Once received, a backside of the material layer may be ground to a desired or predetermined thickness (e.g., 30-300 microns).

From stage 502, the method 500 may proceed to stage 504 where a plurality of holes may be formed in the material layer. For example, the plurality of holes may be formed using plasma etching. From stage 504, the method 500 may proceed to stage 506 where a plurality of vias may be formed. For example, the plurality of vias may be formed by filling the plurality of holes with an electrically conductive material, such as copper, aluminum, gold, etc.

From stage 506, the method 500 may proceed to stage 508 where the plurality of metal channels may be formed. To form the metal channels a mask may be applied to the backside of the material layer using photolithography or silkscreen printing. The mask may define the size, shape, and location of the metal channels. Once the mask is applied, the metal channels may be formed via sputter coating or spin coating the backside of the dia. Once the metal has been applied, the mask can be removed.

The mask does not need to be especially fine. For example, the mask may be on the order of 20 to 100 microns compared to the less than 1 micron feature size of the IC on the top side of the material layer. The die may be formed adjacent or proximate the die. For example, the die may be formed on a wafer material, such as silicon. Once the various dies are formed on the wafer, the dies may be separated from the wafer.

The method 500 may also be utilized to manufacture a microelectronics package, such as microelectronics 100. For example, after a die is formed, the die may be embedded, partially or completely, into a substrate. The second die can be stacked on top of the first die and the first die can be electrically coupled to second die via the pad connections. In addition, a third die or more dies may be connected to the first die or the second die via the pad connections using wire bonding or other bridges.

FIGS. 6A-6C illustrate a top side 602, a first metal layer 604, and a second metal layer 606 of a die 600 in accordance with some embodiments disclosed herein. The die 600 may include a material layer as disclosed herein. The material layer may define a plurality of vias 608 that may extend through the material layer. As shown in FIG. 6B, the first metal layer 604 may include a plurality of voids 610. The voids 610 may allow a first subset of the vias 608 to pass through the first metal layer 604 and contact the second metal layer 606. Thus, the first metal layer 604 and the second metal layer 606 may be at different potentials. For example, the first metal layer 604 may provide power to the die 600 and the second metal layer 606 may be a reference plane. The first metal layer 604 and the second metal layer 606 may be separated by a dielectric 614 or other insulating material. Pad connections 612 may allow power to be delivered to the die 600.

The first metal layer 604 and the second metal layer 606 may form a capacitor. As shown in FIG. 6D, the grinding of the silicon backside may increase surface roughness, increase surface area, thereby increasing capacitance. The capacitance of the first metal layer 604 and the second metal layer 606 may be estimated as:

$$C = \frac{k\varepsilon_0 A}{d}$$

Where k is the dielectric constant (e.g. 6), $\varepsilon_0$ is 8.854E-12 F/m, A is the surface area of the metal layers, and d is the distance between the metal layers. The surface area may be estimated as the length times the width of the metal layers times a factor to account for the surface roughness. For example, assume the various ridges and troughs of the surface are at 45° then the adjustment factor may be 1.41 (the square root of 2). The rougher the surfaces of the metal layers, the greater the capacitance.

Faster data transfer rates, increased performance, and lithography technologies may increase capacitance demands on circuits. To meet this increased capacitance demand, discrete components may be integrated into the IC packaging, or placed board level. Integrating capacitance into the silicon may decrease the electrical length thereby increasing the circuit's reaction time, and reducing the BOM.

Depending on the circuit need and the cost benefit ratio of implementation, further metal layers may be added to increase capacitance and number of power delivery nets. For example, adding a third layer could increase the added capacitance by 100%, or provide capacitance for a different voltage needed by the integrated circuit.

While FIGS. 6A-6D refer to a single die 600, multiple dies may be created having a configuration as disclosed in FIGS. 6A-6D. The various dies may be stacked on top of one another or located adjacent one another. For example, a second die may include a second material layer, a second plurality of vias, a third metal layer, and a fourth metal layer that may be arranged in a similar manner as described with respect to the die 600. In addition, the die 600 may be combined with the die 400 in forming a microelectronics package, such as microelectronics package 100.

FIG. 7 illustrates a method 700 for manufacturing a die, such as die 600. The method 700 may begin at stage 702 where a material layer may be received. The material layer, such as any one of material layers 202 or 204, may have a top side and a backside as disclosed herein. Once receive, a backside of the material layer may be ground to a desired or predetermined thickness (e.g., 30-300 microns).

From stage 702, the method 700 may proceed to stage 704 where a plurality of holes may be formed in the material layer. For example, the plurality of holes may be formed using plasma etching. From stage 704, the method 700 may proceed to stage 706 where a plurality of vias may be formed. For example, the plurality of vias may be formed by filling the plurality of holes with an electrically conductive material, such as copper, aluminum, gold, etc.

From stage 706, the method 700 may proceed to stage 708 where a first metal layer may be formed. The first metal layer may be formed such that a subset of the vias contact the first metal layer as described herein. From stage 708, the method 700 may proceed to stage 710 where a passive layer may be formed adjacent the first metal layer. For example, a dielectric material may be applied to an exposed surface of the first metal layer. The passive layer may be adjusted to result in a desired capacitance. For example, the dielectric material or the thickness of the passive layer may be selected to achieve a desired capacitance.

From stage 710, the method 700 may proceed to stage 712 where a second metal layer may be formed adjacent the second metal layer. The second metal layer may contact a second subset of the vias. Formation of the first and second metal layer may be accomplished using sputter coating or spin coating. In addition, masks may be used in forming the metal layers such that openings within the metal layers may facilitate passage of the vias from the material layer to the various metal layers. In addition to a second metal layer, a third metal layer, or more metal layers, may be formed as disclosed herein.

In addition to forming dies, the method 700 may be part of a method for manufacturing microelectronics packages. For example, a die may be formed as disclosed above and embedded within a substrate. A second die, a third die, etc. may be formed as disclosed herein and stacked on top of the first die or located adjacent the first die to form a microelectronics package. The various dies can be electrically coupled via a plurality of pad connections as disclosed herein.

Figure 8:
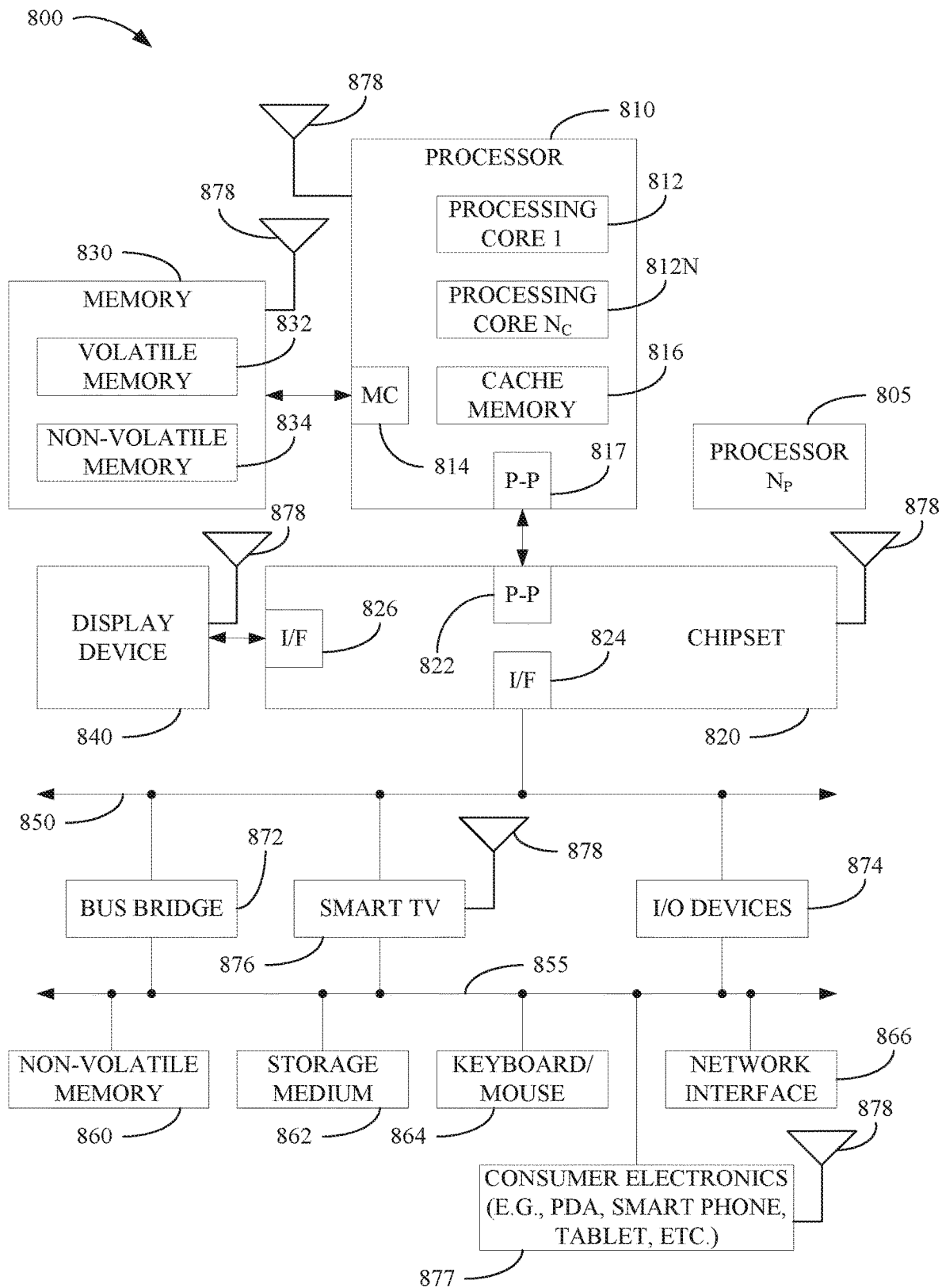
FIG. 8 illustrates a system level diagram in accordance with some embodiments disclosed herein.

FIG. 8 illustrates a system level diagram, according to one embodiment. For instance, FIG. 8 depicts an example of an electronic device (e.g., system) including the microelectronics package 100 or the signaling system as described herein with reference to FIGS. 1-6B. FIG. 8 is included to show an example of a higher level device application for embodiments disclosed herein. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 is a system on a chip (SOC) system.

In one embodiment, processor 810 has one or more processing cores 812 and 812N$_c$, where 812N$_c$ represents the Nth processor core inside processor 810 where N$_c$ is a positive integer. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions, and the like. In some embodiments, processor 810 has a cache memory 816 to cache instructions and/or data for system 800. Cache memory 816 may be organized into a hierarchical structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to an antenna 878 to communicate with any device configured to transmit and/or receive wireless signals. In one embodiment, the antenna interface 878 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), Rambus Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to connect to other elements in system 800. In some embodiments, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805, display device 840, and other devices 872, 876, 874, 860, 862, 864, 866, 877, etc. Chipset 820 may also be coupled to an antenna 878 to communicate with any device configured to transmit and/or receive wireless signals.

Chipset 820 connects to display device 840 via interface (I/F) 826. Display 840 may be, for example, a liquid crystal display (LCD), a plasma display, cathode ray tube (CRT) display, or any other form of visual display device. In some embodiments, processor 810 and chipset 820 are merged into a single SOC. In addition, chipset 820 connects to one or more buses 850 and 855 that interconnect various elements 874, 860, 862, 864, and 866. Buses 850 and 855 may be interconnected together via a bus bridge 872. In one embodiment, chipset 820 couples with a non-volatile memory 860, a mass storage device(s) 862, a keyboard/mouse 864, a network interface 866, smart TV 876, consumer electronics 877, etc., via interface 824.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well known network interface standard including, but not limited to, an Ethernet interface, a universal serial bus (USB) interface, a Peripheral Component interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into processor core 812.

Additional Notes & Examples

Example 1 is a die comprising: a material layer having a top side and a backside, the top side including a plurality of pad connections, the backside including a power connection; a plurality of vias extending through the material layer from the top side to the backside; and a plurality of metal channels in contact with the backside, each of the plurality of metal channels in electrical communication with at least one of the plurality of pad connections and at least one of the plurality of vias, at least one of the plurality of metal channels in electrical communication with the power connection.

In Example 2, the subject matter of Example 1 optionally includes wherein the material layer is comprised of a semiconductor material.

In Example 3, the subject matter of any one or more of Examples 1-2 optionally include wherein the die is one of a plurality of dies located on a semiconductor wafer.

In Example 4, the subject matter of any one or more of Examples 1-3 optionally include wherein the top side comprises integrated circuitry in electrical communication with the plurality of pad connections.

In Example 5, the subject matter of any one or more of Examples 1-4 optionally include wherein at least one of the plurality of metal channels is a reference plane.

In Example 6, the subject matter of any one or more of Examples 1-5 optionally include wherein each of the plurality of metal channels are substantially wider than a width of each of a plurality of signal traces located on the top side of the material layer.

In Example 7, the subject matter of any one or more of Examples 1-6 optionally include wherein each of the plurality of metal channels has a width at least one order of magnitude greater than a width of each of a plurality of signal traces located on the top side of the material layer.

In Example 8, the subject matter of any one or more of Examples 1-7 optionally include wherein the die is a component of a memory board, a motherboard, a sound card, or a video card.

In Example 9, the subject matter of any one or more of Examples 1-8 optionally include wherein the plurality of metal channels are manufactured from a metal selected from the group consisting of copper, gold, platinum, or aluminum.

In Example 10, the subject matter of any one or more of Examples 1-9 optionally include a second material layer having a second top side and a second backside, the second top side including a second plurality of pad connections connected to the plurality of pad connections; a second plurality of vias extending through the second material layer from the second top side to the second backside; and a second plurality of metal channels in contact with the second backside, each of the second plurality of metal channels in electrical communication with at least one of the second plurality of pad connections and at least one of the second plurality of vias.

Example 11 is a microelectronics package comprising: a substrate; a first die at least partially embedded within the substrate, the first die comprising: a first material layer having a first top side and a first backside, the first top side including a first plurality of pad connections, a first plurality of vias extending through the first material layer from the first top side to the first backside, and a first plurality of metal channels in contact with the first backside, each of the first plurality of metal channels in electrical communication with at least one of the first plurality of pad connections and at least one of the first plurality of vias; and a second die comprising: a second material layer having a second top side and a second backside, the second top side including a second plurality of pad connections in electrical communication with the first plurality of pad connections, a second plurality of vias extending through the second material layer from the second top side to the second backside, and a second plurality of metal channels in contact with the second backside, each of the second plurality of metal channels in electrical communication with at least one of the second plurality of pad connections and at least one of the second plurality of vias.

In Example 12, the subject matter of Example 11 optionally includes a third die; and a bridge electrically connecting third die to at least one of the first die and the second die.

In Example 13, the subject matter of any one or more of Examples 11-12 optionally include a third die; and a bridge electrically connecting third die to the first die.

In Example 14, the subject matter of any one or more of Examples 11-13 optionally include a third die; and a bridge electrically connecting third die to the second die.

In Example 15, the subject matter of any one or more of Examples 11-14 optionally include wherein the first material layer and the second material layer are comprised of a semiconductor based material.

In Example 16, the subject matter of any one or more of Examples 11-15 optionally include wherein the first top side comprises first integrated circuitry in electrical communication with the first plurality of pad connections.

In Example 17, the subject matter of any one or more of Examples 11-16 optionally include wherein the second top side comprises second integrated circuitry in electrical communication with the second plurality of pad connections.

In Example 18, the subject matter of any one or more of Examples 11-17 optionally include wherein the first plurality of metal channels is a reference plane.

In Example 19, the subject matter of any one or more of Examples 11-18 optionally include wherein each of the first plurality of metal channels are substantially wider than a width of each of a first plurality of signal traces located on the first top side of the first material layer.

In Example 20, the subject matter of any one or more of Examples 11-19 optionally include wherein each of the second plurality of metal channels are substantially wider than a width of each of a second plurality of signal traces located on the second top side of the second material layer.

In Example 21, the subject matter of any one or more of Examples 11-20 optionally include wherein each of the first plurality of metal channels has a width at least one order of magnitude greater than a width of each of a first plurality of signal traces located on the first top side of the first material layer.

In Example 22, the subject matter of any one or more of Examples 11-21 optionally include wherein each of the second plurality of metal channels has a width at least one order of magnitude greater than a width of each of a second plurality of signal traces located on the second top side of the second material layer.

In Example 23, the subject matter of any one or more of Examples 11-22 optionally include wherein the microelectronics package is a component of computing device.

In Example 24, the subject matter of any one or more of Examples 11-23 optionally include wherein the first plurality of metal channels and the second plurality of metal channels are manufactured from a metal selected from the group consisting of copper, gold, platinum, or aluminum.

Example 25 is a method of manufacturing a die, the method comprising: receiving a material layer having top side and a backside; forming a plurality of holes in the material layer; forming a plurality of vias, each of the plurality of vias corresponding to one of the plurality of holes; and forming a plurality of metal channels on the backside of the material layer, each of the plurality of metal channels electrically connecting a corresponding subset of the plurality of vias.

In Example 26, the subject matter of Example 25 optionally includes grinding the backside of the material layer until the material layer is a predetermined thickness.

In Example 27, the subject matter of any one or more of Examples 25-26 optionally include applying a mask to the backside of the material layer prior to forming the plurality of metal channels, the mask defining a location and shape for each of the plurality of metal channels.

In Example 28, the subject matter of any one or more of Examples 25-27 optionally include wherein forming the plurality of metal channels includes sputter coating or spin coating the backside with a metal.

In Example 29, the subject matter of any one or more of Examples 25-28 optionally include separating the material layer from a wafer.

In Example 30, the subject matter of any one or more of Examples 25-29 optionally include forming a second die proximate the die.

Example 31 is a method of manufacturing a microelectronics package, the method comprising: forming a substrate; forming a first die and a second die, wherein forming each of the first die and the second die comprises: plurality of holes in a material layer having a top side and a backside, forming a plurality of vias, each of the plurality of vias corresponding to one of the plurality of holes, and forming a plurality of metal channels on the backside of the material layer, each of the plurality of metal channels electrically connecting a corresponding subset of the plurality of vias; embedding, at least partially, the first die into the substrate; stacking the second die on top of the first die; and electrically coupling the first die to the second die via a plurality of pad connections.

In Example 32, the subject matter of Example 31 optionally includes wherein forming the first die and the second die further comprises grinding the backside of the material layer until the material layer is a predetermined thickness.

In Example 33, the subject matter of any one or more of Examples 31-32 optionally include wherein forming the first die and the second die further comprises applying a mask to the backside of the material layer prior to forming the plurality of metal channels, the mask defining a location and shape for each of the plurality of metal channels.

In Example 34, the subject matter of any one or more of Examples 31-33 optionally include wherein forming the plurality of metal channels includes sputter coating or spin coating the backside with a metal.

In Example 35, the subject matter of any one or more of Examples 31-34 optionally include wherein forming the first die and the second die further comprises separating the material layer from a wafer.

In Example 36, the subject matter of any one or more of Examples 31-35 optionally include attaching a third die to the substrate and electrically coupling the third die to the first die.

In Example 37, the subject matter of any one or more of Examples 31-36 optionally include attaching a third die to the substrate and electrically coupling the third die to the second die.

In Example 38, the subject matter of any one or more of Examples 31-37 optionally include attaching a third die to the substrate and electrically coupling the third die to the first die and the second die.

Example 39 is a die comprising: a material layer having a top side and a backside, the top side including a plurality of pad connections, the backside including a power connection; a plurality of vias extending through the material layer from the top side to the backside; a first metal layer in contact with the backside, the first metal layer in electrical communication with at least one of the plurality of pad connections and a first subset of the plurality of vias; and a second metal layer located adjacent to the first metal layer and separated by a dielectric, the second metal layer in electrical communication with a second subset of the plurality of vias, wherein the first metal layer or the second metal layer is in electrical communication with the power connection.

In Example 40, the subject matter of Example 39 optionally includes wherein the material layer is comprised of a semiconductor based material.

In Example 41, the subject matter of any one or more of Examples 39-40 optionally include wherein the die is one of a plurality of dies located on a semiconductor wafer.

In Example 42, the subject matter of any one or more of Examples 39-41 optionally include wherein the top side comprises integrated circuitry in electrical communication with the plurality of pad connections.

In Example 43, the subject matter of any one or more of Examples 39-42 optionally include wherein the second metal layer is reference planes.

In Example 44, the subject matter of any one or more of Examples 39-43 optionally include wherein the die is a component of a memory board, a motherboard, a sound card, or a video card.

In Example 45, the subject matter of any one or more of Examples 39-44 optionally include wherein the first metal layer and the second metal layer are manufactured from a metal selected from the group consisting of copper, gold, platinum, or aluminum.

In Example 46, the subject matter of any one or more of Examples 39-45 optionally include a second material layer having a second top side and a second backside, the second top side including a second plurality of pad connections connected to the plurality of pad connections; a second plurality of vias extending through the second material layer from the second top side to the second backside; a third metal layer in contact with the second backside, the third metal layer in electrical communication with at least one of the second plurality of pad connections and a first subset of the second plurality of vias; and a fourth metal layer located adjacent to the third metal layer and separated by a second dielectric, the fourth metal layer in electrical communication with a second subset of the second plurality of vias.

Example 47 is a microelectronics package comprising: a substrate; a first die at least partially embedded within the substrate, the first die comprising: a first material layer having a first top side and a second backside, the first top side including a first plurality of pad connections, a first plurality of vias extending through the first material layer from the first top side to the first backside, a first metal layer in contact with the first backside, the first metal layer in electrical communication with at least one of the first plurality of pad connections and a first subset of the first plurality of vias, and a second metal layer located adjacent to the first metal layer and separated by a first dielectric, the second metal layer in electrical communication with a second subset of the first plurality of vias; a second die comprising: a second material layer having a second top side and a second backside, the second top side including a second plurality of pad connections in electrical communication with the first plurality of pad connections, a second plurality of vias extending through the second material layer from the second top side to the second backside, and a third metal layer in contact with the second backside, the third metal layer in electrical communication with at least one of the second plurality of pad connections and a first subset of the second plurality of vias, and a fourth metal layer located adjacent to the third metal layer and separated by a second dielectric, the fourth metal layer in electrical communication with a second subset of the second plurality of vias.

In Example 48, the subject matter of Example 47 optionally includes a third die; and a bridge electrically connecting third die to at least one of the first die and the second die.

In Example 49, the subject matter of any one or more of Examples 47-48 optionally include a third die; and a bridge electrically connecting third die to the first die.

In Example 50, the subject matter of any one or more of Examples 47-49 optionally include a third die; and a bridge electrically connecting third die to the second die.

In Example 51, the subject matter of any one or more of Examples 47-50 optionally include wherein the first material layer and the second material layer are comprised of a semiconductor based material.

In Example 52, the subject matter of any one or more of Examples 47-51 optionally include wherein the first top side comprises first integrated circuitry in electrical communication with the first plurality of pad connections.

In Example 53, the subject matter of any one or more of Examples 47-52 optionally include wherein the second top side comprises second integrated circuitry in electrical communication with the second plurality of pad connections.

In Example 54, the subject matter of any one or more of Examples 47-53 optionally include wherein the first metal layer is a reference plane.

In Example 55, the subject matter of any one or more of Examples 47-54 optionally include wherein the third metal layer is a reference plane.

In Example 56, the subject matter of any one or more of Examples 47-55 optionally include wherein the second and fourth metal layers are reference plane.

In Example 57, the subject matter of any one or more of Examples 47-56 optionally include wherein the microelectronics package is a component of computing device.

In Example 58, the subject matter of any one or more of Examples 47-57 optionally include wherein the first, second, third, and fourth metal layers are manufactured from a metal selected from the group consisting of copper, gold, platinum, or aluminum.

Example 59 is a method of manufacturing a die, the method comprising: receiving a material layer having top side and a backside; forming a plurality of holes in the material layer; forming a plurality of vias, each of the plurality of vias corresponding to one of the plurality of holes; forming a first metal layer on the backside of the material layer, the metal layer electrically connecting a corresponding first subset of the plurality of vias; forming a passive layer adjacent the first metal layer; and forming a second metal layer on the passive layer, the second metal layer electrically connecting a corresponding second subset of the plurality of vias.

In Example 60, the subject matter of Example 59 optionally includes grinding the backside of the material layer until the material layer is a predetermined thickness.

In Example 61, the subject matter of any one or more of Examples 59-60 optionally include applying a mask to the backside of the material layer prior to forming the first metal layer, the mask defining a location for each of the first plurality second subset of the plurality of vias to pass through the first metal layer.

In Example 62, the subject matter of any one or more of Examples 59-61 optionally include wherein forming the first metal layer includes sputter coating or spin coating the backside with a metal.

In Example 63, the subject matter of any one or more of Examples 59-62 optionally include wherein forming the second metal layer includes sputter coating or spin coating one side of the passive layer.

In Example 64, the subject matter of any one or more of Examples 59-63 optionally include separating the material layer from a wafer.

In Example 65, the subject matter of any one or more of Examples 59-64 optionally include forming a second die proximate the die.

In Example 66, the subject matter of any one or more of Examples 59-65 optionally include grinding the first metal layer or the second metal layer to increase surface roughness.

Example 67 is a method of manufacturing a microelectronics package, the method comprising: forming a substrate; forming a first die and a second die, wherein forming each of the first die and the second die comprises: plurality of holes in a material layer having a top side and a backside, forming a plurality of vias, each of the plurality of vias corresponding to one of the plurality of holes, forming a first metal layer on the backside of the material layer, the first metal layer electrically connecting a corresponding first subset of the plurality of vias, forming a passive layer adjacent the first metal layer, and forming a second metal layer on a side of the passive layer, the second metal layer electrically connecting a corresponding second subset of the plurality of vias; embedding, at least partially, the first die into the substrate; stacking the second die on top of the first die; and electrically coupling the first die to the second die via a plurality of pad connections.

In Example 68, the subject matter of Example 67 optionally includes wherein forming the first die and the second die further comprises grinding the backside of the material layer until the material layer is a predetermined thickness.

In Example 69, the subject matter of any one or more of Examples 67-68 optionally include wherein forming the first die and the second die further comprises applying a mask to the backside of the material layer prior to forming the first metal layer, the mask defining a location for each of the first plurality second subset of the plurality of vias to pass through the first metal layer.

In Example 70, the subject matter of any one or more of Examples 67-69 optionally include wherein forming the first metal layer includes sputter coating or spin coating the backside with a metal.

In Example 71, the subject matter of any one or more of Examples 67-70 optionally include wherein forming the second metal layer includes sputter coating or spin coating one side of the passive layer.

In Example 72, the subject matter of any one or more of Examples 67-71 optionally include wherein forming the first die and the second die further comprises separating the material layer from a wafer.

In Example 73, the subject matter of any one or more of Examples 67-72 optionally include attaching a third die to the substrate and electrically coupling the third die to the first die.

In Example 74, the subject matter of any one or more of Examples 67-73 optionally include attaching a third die to the substrate and electrically coupling the third die to the second die.

In Example 75, the subject matter of any one or more of Examples 67-74 optionally include attaching a third die to the substrate and electrically coupling the third die to the first die and the second die.

In Example 76, the subject matter of any one or more of Examples 67-75 optionally include grinding the first metal layer or the second metal layer of the first die or the second die to increase surface roughness.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplate are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims; the terms "including" and "in which" are used as the plain-English equivalents of the respective terms "comprising" and "wherein." Also, in the following claims, the terms "including" and "comprising" are open-ended; that is, a system, device, article; or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure and is submitted with the understanding that it will not be used to interpret or limit the scope or meaning of the claims. Also, in the above Detailed Description, various features may be grouped together to streamline the disclosure. However, the claims may not set forth features disclosed herein because embodiments may include a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

The invention claimed is:

1. A method of manufacturing a die, the method comprising:
   receiving a material layer having top side and a backside;
   forming a plurality of holes in the material layer;
   forming a plurality of vias, each of the plurality of vias corresponding to one of the plurality of holes; and
   forming a plurality of metal channels on the backside of the material layer, each of the plurality of metal channels electrically connecting a corresponding subset of the plurality of vias.

2. The method of claim 1, further comprising grinding the backside of the material layer until the material layer is a predetermined thickness.

3. The method of claim 1, further comprising applying a mask to the backside of the material layer prior to forming the plurality of metal channels, the mask defining a location and shape for each of the plurality of metal channels.

4. The method of claim 1, wherein forming the plurality of metal channels includes sputter coating or spin coating the backside with a metal.

5. The method of claim 1, further comprising separating the material layer from a wafer.

6. The method of claim 1, further comprising forming a second die proximate the die.

7. A method of manufacturing a microelectronics package, the method comprising:
   forming a substrate;
   forming a first die and a second die, wherein forming each of the first die and the second die comprises:
      plurality of holes in a material layer having a top side and a backside,
      forming a plurality of vias, each of the plurality of vias corresponding to one of the plurality of holes, and
      forming a plurality of metal channels on the backside of the material layer, each of the plurality of metal channels electrically connecting a corresponding subset of the plurality of vias;
   embedding, at least partially, the first die into the substrate;
   stacking the second die on top of the first die; and
   electrically coupling the first die to the second die via a plurality of pad connections.

8. The method of claim 7, wherein forming the first die and the second die further comprises grinding the backside of the material layer until the material layer is a predetermined thickness.

9. The method of claim 7, wherein forming the first die and the second die further comprises applying a mask to the backside of the material layer prior to forming the plurality of metal channels, the mask defining a location and shape for each of the plurality of metal channels.

10. The method of claim 7, further comprising attaching a third die to the substrate and electrically coupling the third die to the first die.

11. The method of claim 7, further comprising attaching a third die to the substrate and electrically coupling the third die to the second die.

12. The method of claim 7, further comprising attaching a third die to the substrate and electrically coupling the third die to the first die and the second die.

13. A method of manufacturing a die, the method comprising:
   receiving a material layer having top side and a backside;
   forming a plurality of holes in the material layer;
   forming a plurality of vias, each of the plurality of vias corresponding to one of the plurality of holes;
   forming a first metal layer on the backside of the material layer, the metal layer electrically connecting a corresponding first subset of the plurality of vias;
   forming a passive layer adjacent the first metal layer; and
   forming a second metal layer on the passive layer, the second metal layer electrically connecting a corresponding second subset of the plurality of vias.

14. The method of claim 13, further comprising grinding the backside of the material layer until the material layer is a predetermined thickness.

15. The method of claim 13, further comprising applying a mask to the backside of the material layer prior to forming the first metal layer, the mask defining a location for each of the first plurality second subset of the plurality of vias to pass through the first metal layer.

16. The method of claim 13, further comprising separating the material layer from a wafer.

17. The method of claim 13, further comprising forming a second die proximate the die.

18. The method of claim 13, further comprising grinding the first metal layer or the second metal layer to increase surface roughness.

19. A method of manufacturing a microelectronics package, the method comprising:
   forming a substrate;
   forming a first die and a second die, wherein forming each of the first die and the second die comprises:
      plurality of holes in a material layer having a top side and a backside,
      forming a plurality of vias, each of the plurality of vias corresponding to one of the plurality of holes,
      forming a first metal layer on the backside of the material layer, the first metal layer electrically connecting a corresponding first subset of the plurality of vias,
      forming a passive layer adjacent the first metal layer, and
      forming a second metal layer on a side of the passive layer, the second metal layer electrically connecting a corresponding second subset of the plurality of vias;
   embedding, at least partially, the first die into the substrate;
   stacking the second die on top of the first die; and
   electrically coupling the first die to the second die via a plurality of pad connections.

20. The method of claim 19, wherein forming the first die and the second die further comprises grinding the backside of the material layer until the material layer is a predetermined thickness.

21. The method of claim 19, wherein forming the first die and the second die further comprises applying a mask to the backside of the material layer prior to forming the first metal layer, the mask defining a location for each of the first plurality second subset of the plurality of vias to pass through the first metal layer.

22. The method of claim 19, wherein forming the first die and the second die further comprises separating the material layer from a wafer.

23. The method of claim 19, further comprising attaching a third die to the substrate and electrically coupling the third die to the first die.

24. The method of claim 19, further comprising attaching a third die to the substrate and electrically coupling the third die to the second die.

25. The method of claim 19, further comprising attaching a third die to the substrate and electrically coupling the third die to the first die and the second die.

* * * * *